United States Patent

Kianush et al.

Patent Number: 5,430,891
Date of Patent: Jul. 4, 1995

[54] TUNING DETECTION CIRCUIT FOR A HIGH-FREQUENCY RECEIVER, AND RECEIVER INCLUDING SUCH DETECTION CIRCUIT

[75] Inventors: Kaveh Kianush; Engelbertus C. J. Egelmeers; Johannes C. M. Meeuwis, all of Eindhoven, Netherlands

[73] Assignee: U.S. Philips Corporation, New York, N.Y.

[21] Appl. No.: 108,018

[22] Filed: Aug. 17, 1993

[30] Foreign Application Priority Data

Aug. 18, 1992 [EP] European Pat. Off. ............ 92202519

[51] Int. Cl.⁶ .............................................. H04B 1/16
[52] U.S. Cl. .............................. 455/184.1; 455/182.3
[58] Field of Search ............... 455/184.1, 185.1, 186.1, 455/186.2, 205, 182.1, 182.2, 182.3

[56] References Cited

U.S. PATENT DOCUMENTS

| | | | |
|---|---|---|---|
| 4,172,995 | 10/1979 | Yoshisato | 455/182.1 |
| 4,509,203 | 4/1985 | Yamada | 455/184.1 |
| 4,726,073 | 2/1988 | Sessink | 455/205 |

FOREIGN PATENT DOCUMENTS 60-72222 1/1985 Japan .

*Primary Examiner*—Reinhard J. Eisenzopf
*Assistant Examiner*—Thanh Le
*Attorney, Agent, or Firm*—Leroy Eason

[57] ABSTRACT

A tuning detection circuit for a high-frequency modulated RF signal which is within the frequency band of a receiver. A level signal (1e) is derived which is a measure of a level of the modulated RF signal, and is combined with a signal from a window comparator (20, 21) to which a filtered demodulated signal derived from the modulated RF signal is applied. The detection circuit supplies an in-channel signal (in-1) which indicates whether a desired tuning state has been reached. To prevent that upon detection of stations in a busy frequency band incorrect in-channel signals (in-1) are generated, i.e., signals indicating that the tuning process has been completed even though tuning is actually between two stations instead of to one station, the detection device also combines the level and in-channel signals with output signals of the window comparator, compared by means of a phase comparator (50).

6 Claims, 3 Drawing Sheets

TUNING DETECTION CIRCUIT FOR A HIGH-FREQUENCY RECEIVER, AND RECEIVER INCLUDING SUCH DETECTION CIRCUIT

BACKGROUND OF THE INVENTION

1. Field of the Invention

The invention relates to the detection device for detecting a tuning state of a high-frequency modulated signal within a frequency band, having an output for supplying an in-channel signal indicating whether a desired tuning state has been reached. The detection device comprises a window comparator having an input for receiving a filtered, demodulated version of the high-frequency modulated signal, and an input for receiving a level signal which is a measure of the level of the high-frequency modulated signal. The in-channel signal is formed, by means of a combination device, from the output signals of the window comparator combined with the level signal.

The invention also relates to a receiver for receiving high-frequency signals and comprising such a detection device. Such a receiver may be a radio receiver, a television receiver, a video recorder or a cordless or mobile telephone.

2. Description of the Related Art

A detection device of this kind for the detection of a tuning state of a high-frequency modulated signal within a frequency band is known from Japanese Patent Application No. 58-115419, Kokai 60-7222/85. The known detection device, intended to reduce so-called muting in an FM receiver, comprises a window comparator whereto there is applied a filtered, demodulated version of a high-frequency modulated signal to be applied to the FM receiver, and also comprises an input for receiving a level signal which is supplied by a level device which is included in the FM receiver and which serves to produce a level signal which is a measure of the level of the high-frequency modulated signal. The known detection device also comprises a combination device which is formed by two gates whereby an in-channel signal is formed output signals of the window comparator and from the level signal. The in-channel signal is applied to tuning control means which are not shown in the cited Kokai.

It is known that the detection characteristic of a discriminator such as an FM detector is S-shaped in relation to an RF frequency sweep around a frequency whereto the tuner is tuned. This characteristic passes through zero at the tuning frequency, is referred to as the so-called S-curve. A window comparator, consisting of two comparator circuits with hysteresis, imposes two detection thresholds on the S-curve, so that it can be determined whether the filtered demodulated version of the high-frequency modulated signal is around a signal zero level which is between the two detection thresholds. In order to avoid that the detection device provides an in-channel indication when no station is being received, i.e. if there is no RF signal, level information of the RF signal is also taken into account. An AND-combination of the signals derived from the S-curve detection and the level detection produces an in-channel signal. In a search mode, pulses from the detection device can be filtered, if desired, in order to obtain a suitably defined in-channel signal.

A problem encountered during use of the known detection device in inter alia the search mode in an FM receiver, consists in that incorrect in-channel signals may be generated, which incorrect signals may cause tuning to a "wrong" slope of the S-curve where no station is situated; this may occur notably in the event of a frequency band comprising many stations which may be situated very near to one another. This is because the signal level of a station may then be situated between the signal levels of two other stations which are above the adjusted detection thresholds, and because intermediate frequency filters do not adequately suppress the adjacent channels. In practical cases the S-curve will also be distorted in the event of a busy frequency band. Moreover, the requirements imposed on the low-pass filter preceding the detection device will differ in the preset mode and the search mode, and choosing a compromise may give rise to an increased number of mistunings. Measurements have shown that wrong slopes of the S-curve over the frequency band tend to be steeper than correct slopes, so that incorrect in-channel pulses generally are shorter than correct in-channel pulses. When use is made of a filter connected to the output of the detection device, requirements which are more difficult to combine are then also imposed on this filter. The compromise to be chosen in this respect may also lead to an increased number of mistunings.

SUMMARY OF THE INVENTION

It is the object of the invention to provide a tuning detector for detecting when the tuning state of a high-frequency modulated signal falls within a selected frequency band, which is reliable and accurate, and which does not give rise to any mistuning or at least minimizes the number of mistunings.

A tuning detector in one embodiment in accordance with the invention is characterized in that it comprises a differentiation circuit having an input for receiving the filtered demodulated high-frequency signal, and a combining circuit which forms the in-channel signal also from a signal supplied by the differentiation circuit. In the search mode, the described variation of the S-curve over the frequency band is utilized, i.e. a slope-sensitive detection is achieved by differentiation, thus enabling discrimination between incorrect and correct in-channel signals or pulses.

Because the solution to the above problem by slope differentiation does not result in production a reliable in-channel signal in all received RF signal circumstances, a preferred turning detector in accordance with the invention is characterized in that it comprises a slope detection circuit for slope detection of the filtered, demodulated high-frequency signal, which slope detection circuit is coupled to the window comparator, and that the combining circuit forms the in-channel signal also from a signal supplied by the slope detection circuit. Thus, a very reliable tuning detector is obtained which is not critically dependent on time constants to be chosen, i.e. the time constants to be chosen can be chosen so as to be optimum. The invention is based on the idea that during an up-search (increasing frequency), for a correct slope of the S-curve, a comparator having a higher reference level in the window comparator supplies a logic signal "1" sooner than a comparator having a lower reference level supplies a logic signal "0", whereas for a wrong slope the comparator of lower reference level supplies a logic signal "1" before the comparator of higher reference level supplies a logic signal "0". Thus, the slope detection is actually based on the phase relation between the output signals of the two comparators in the window comparator. A similar signal behaviour occurs during a down-search, be it inverted with respect to an up-search.

A further embodiment of a tuning detector in accordance with the invention is characterized in that the slope detection circuit is a phase comparator. The phase comparator is capable of identifying said phase relation.

A further embodiment of a tuning detector in accordance with the invention, for use in providing in a search mode of a receiver, is characterized in that the reference signals of the window comparator are adjustable. During the search mode and for a first value of the in-channel signal the reference signals are adjusted to establish a window which is narrower than after termination of the search mode and for a second value of the in-channel signal. In a two-loop tuning system, as included in a receiver as described in the simultaneously filed European Patent Application No. 92202520.0, better cooperation between the loop systems is thus possible. This is because an excessively wide window in the search mode can lead to overshoot to a station other than the desired station. An additional advantage of such an adjustment resides in the fact that less annoyance is experienced from audio modulation and that the tuning detector is capable of generating a correct in-channel signal on the basis of only one non-critical rime constant, that being the time constant of a filter preceding the tuning detection.

BRIEF DESCRIPTION OF THE DRAWINGS

The invention will be described in detail hereinafter with reference to the drawings, therein.

DESCRIPTION OF THE PREFERRED EMBODIMENTS

Figure 1:
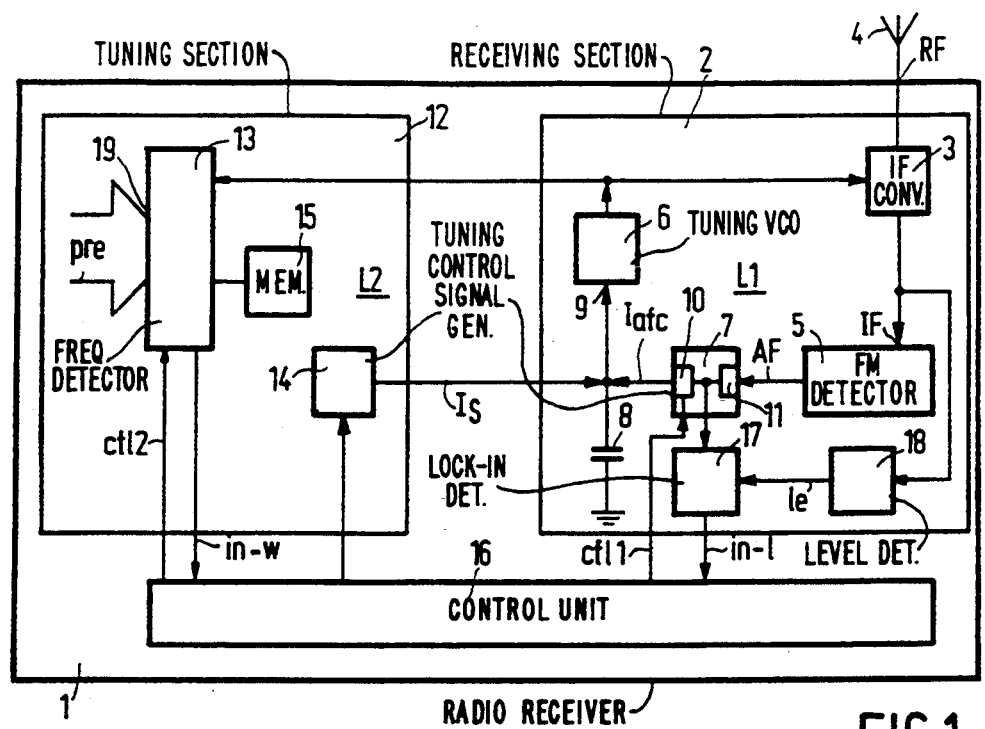
FIG. 1 shows a block diagram of a receiver in accordance with the invention.

FIG. 1 shows a block diagram of a receiver 1 in accordance with the invention. The receiver 1 comprises a receiving section 2 which includes a first frequency loop L1 with a frequency conversion device 3 for frequency conversion of a high-frequency modulated signal RF, to be applied to the receiving section 2 via an aerial 4, into a modulated signal IF of lower frequency. The frequency loop L1 also comprises an FM detector 5 for detection of an information signal present in the modulated signal of lower frequency IF, for example a radio or television broadcast signal or a telephone signal, and a tuning oscillator 6 which is coupled to the frequency conversion device 3 and whose frequency can be adjusted by means of a first tuning control signal $I_{afc}$ to be supplied by a first tuning control signal generator 7 coupled to the detection device 5. The tuning control signal generator 7 may comprise a controlled current source 10 which applies a tuning control signal $I_{afc}$ in the form of a current to a loop filter 8, preferably an integrator, which is formed, for example by a capacitor for integration of the current $I_{afc}$, so that there is formed a control voltage $\int I_{afc}.dt$ for supply to a control input 9 for controlling the tuning oscillator 6, being a VCO (Voltage Controlled Oscillator) in the present embodiment. The tuning control signal generator 7 also comprises a low-pass filter 11 which filters the output signal of the FM detector 5, for example an FM discriminator, and outputs it as a control signal for the controlled current source 10. In a superheterodyne receiver the frequency conversion device 3 may be a customary mixing stage for mixing the high-frequency modulated signal RF so as to form the modulated signal of lower frequency IF, being an intermediate frequency, for example 10.7 MHz in the event of broadcast FM. Conventional selective intermediate frequency amplifiers comprising fixed filter sections, then present in the receiving section 2, are assumed to be included in the FM detector 5 for the sake of simplicity. Other customary structures are also feasible for the receiving section 2, for as long as a suitable control signal can be applied to the tuning oscillator 6 for frequency tuning thereof in the first frequency loop L1. The invention is not restricted to FM signals, other modulation types such as AM and PM, also being feasible. Instead of a superheterodyne structure, a receiving section 2 having a so-called direct-conversion structure which is very well suitable for integration is also feasible. In order to minimize tuning errors in the receiving section 2, per se, caused by DC offsets and leakage currents in the AFC loop, the current source 10 should have a very high output impedance; this can be achieved, for example by choosing a so-called Wilson current mirror configuration in which an input current is applied to a conventional current mirror configuration but an output current is supplied via an output transistor in cascode connection with a mirror transistor. The input current of the current source 10, supplied via the low-pass filter 11, can then be delivered by a voltage/current converter (not shown) coupled to symmetrical outputs of the detector 5 (not shown herein).

The receiver also comprises a tuning section 12 which includes a second frequency loop L2 with a frequency detector 13 for measuring the frequency of the tuning oscillator 6, and a second tuning control signal generator 14 which can be coupled to the frequency detector 13 and which serves to generate a second tuning control signal $I_s$ to be applied to the tuning oscillator 6. A measured frequency of the tuning oscillator 6 can be stored in a last-channel memory 15. The receiver also comprises a control unit 16 for controlling the receiving section 2 and the tuning section 12. In the preset mode (preset tuning) of the receiver 1, the control unit 16 will control and/or open or close the first and/or the second frequency loop L1 and L2, i.e. in this mode both frequency loops L1 and L2 are active. During operation of the receiver 1 in the search mode (autosearch tuning), in given circumstances only the first frequency loop L1 is active, the frequency detector 13 being used to measure the frequency of the relevant station after a station has been found. The control unit 16 can close the frequency loop L1 at least in dependence on a first control signal in-I (in-lock signal) to be supplied by the receiving section 2. Depending on the mode of operation of the receiver 1, the control unit 16 controls the first and/or the second frequency loop L1 and L2 also on the basis of a second control signal in-w (in-window signal) to be applied to the control unit 16 by the frequency detector 13. The in-lock signal in-1 is formed, by an in-lock detector 17, from the AFC signal from the FM detector 5, filtered by the low-pass filter 11, and from a level signal 1e which can be supplied by a level detector 18 and which is a measure of the level of the high-frequency modulated signal RF. The in-lock detector 17 supplies a reliable in-lock signal, indicating that the first frequency loop has been adjusted with a given accuracy, by very accurate analysis of the so-called S-curve of the FM detector 5. The control unit 16 also supplies control signals ctl1 and ctl2 to the current source 10 and the frequency detector 13 for respective control and on/off switching. The control unit can also autonomously control the second tuning control signal generator 14, which may be a controllable charge pump having several control inputs, in the autosearch mode. The frequency detector 13 may be a programmable counter having a preset input 19 for receiving a digital preset signal pre which can be supplied by a microprocessor (not shown) or also, in a simple and inexpensive embodiment of the receiver 1 in accordance with the invention, by a hardware preset device consisting of a number of flipflop registers. Such a simple embodiment can be implemented in comparatively inexpensive portable radio receivers. The presets can be adjusted during the autosearch mode or also via a frequency which can be entered via a keyboard and which is loaded into the preset registers after having been digitized. For a more elaborate description of the receiver 1, reference is made to the simultaneously filed European Patent Application No. 9220252.0 cited above, which corresponds to U.S. application Ser. No. 107,544 of the present applicants, filed concurrently herewith, assigned to the same assignee.

Figure 2:
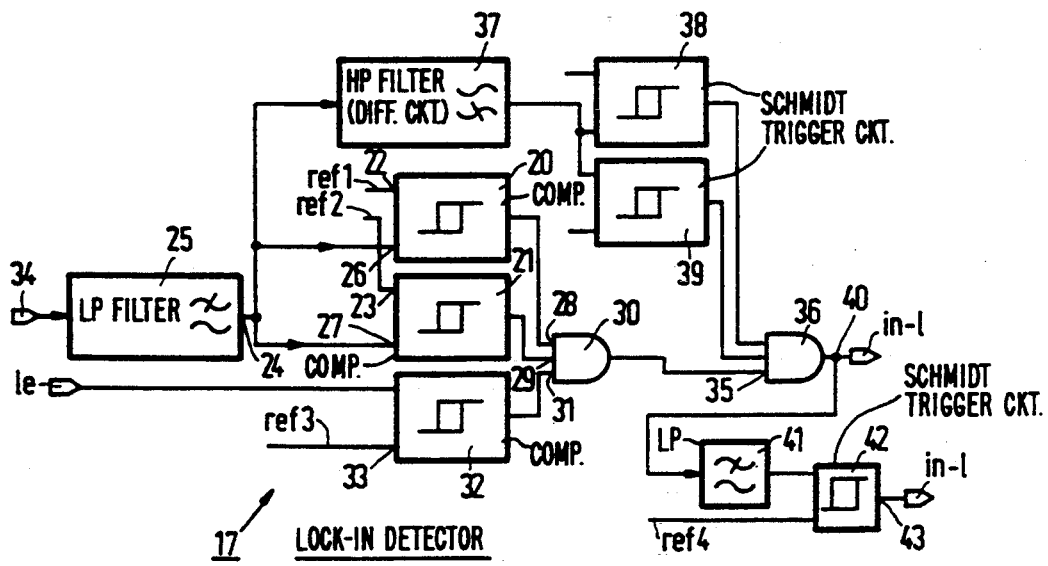
FIG. 2 shows a first embodiment of a detection device in accordance with the invention.

FIG. 2 shows a first embodiment of a tuning detector for detecting a tuning state of a high-frequency modulated signal, i.e. an in-lock tuning detector 17 in accordance with the invention. The tuning detector 17 comprises a window comparator which is formed by two comparators 20 and 21 having hysteresis and supplied with upper and lower reference voltages on inputs 22 and 23, said window comparator being connected at its input side to an output 24 of a low-pass filter 25 which applies a filtered, demodulated version of the high-frequency modulated signal RF to inputs 26 and 27 of the comparators 20 and 21. The comparators with hysteresis may be so-called Schmitt triggers circuits. At their output side the comparators 20 and 21 are connected to inputs 28 and 29 of an AND-gate 30, an input 31 of which receives the level signal 1e, again via a comparator 32 with hysteresis, said level signal being a measure of the level of the high-frequency modulated received signal RF. The sensitivity of the tuning detector can be adjusted via a reference signal ref3 applied to an input 33 of the comparator 32. An input 34 of the low-pass filter 25 receives a demodulated version of the high-frequency modulated signal RF, that being a signal AF from the FM detector 5. The filter 25 of the tuning detector 17 corresponds to the filter 11 of FIG. 1.

The AND-gate 30 is connected at its output side to an input 35 of an AND gate 36 whereto there is also coupled a differentiation circuit which is formed by a high-pass filter 37 and two Schmitt triggers 38 and 39 for detection of a version of the input signal of the window comparator which has been differentiated by the high-pass filter 37. The in-channel (or in-lock) signal in-1 is available at an output 40 of the AND-gate 36 or, via a low-pass filter 41 which is coupled to the output 40 and a Schmitt trigger 42 which is coupled thereto, at an output 43 of the Schmitt trigger 42 which also receives a reference signal ref4. Thus, the in-channel signal in-1 is formed, by a combination device consisting of the AND-gates 30 and 36, from output signals of the window comparator, from the level signal 1e, and from a differentiated version of the filtered, demodulated high-frequency signal. In this respect use is made of the fact that a wrong slope of the S-curve over a frequency band, i.e. slope thereof between stations in the frequency band for which the tuning detector would produce an incorrect in-channel signal, generally tends to be steeper than a correct slope of the S-curve, i.e. a slope on which a correct signal is situated. This embodiment has the drawback however, as has already been described, that a reliable in-lock signal may not be obtained in all signal circumstances of the received signal RF.

Figure 3:
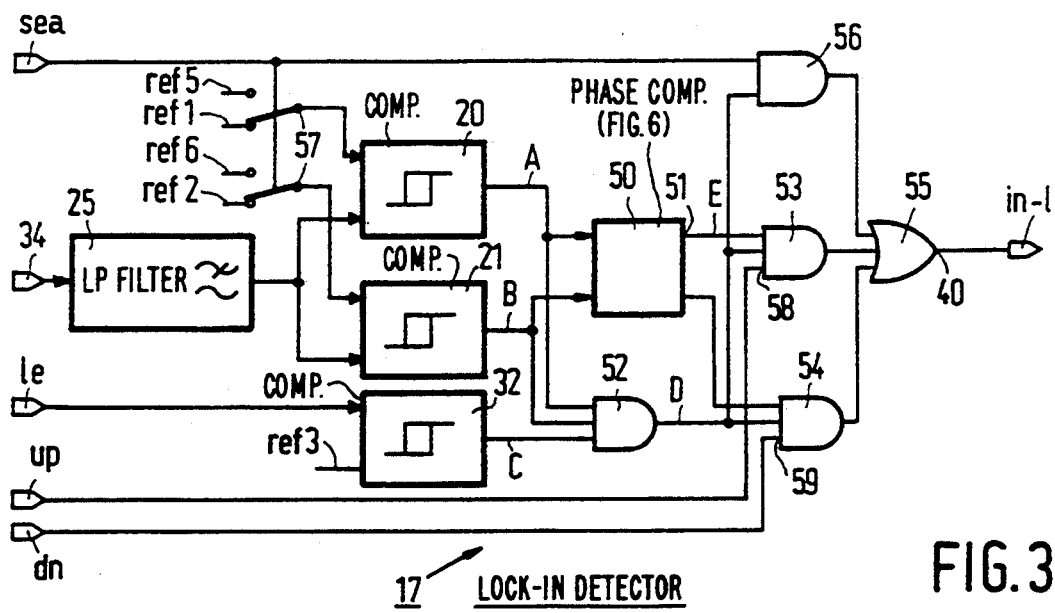
FIG. 3 shows a second embodiment of a detection device in accordance with the invention.

FIG. 3 shows a second, preferred embodiment of an in-lock tuning detector in accordance with the invention. Therein, signals and circuit units corresponding to FIG. 2 are denoted by corresponding references. The comparators 20 and 21 supply signals A and B which are applied to slope detector which here is a phase comparator 50, commercially available as a circuit MC4044, an output 51 of which supplies a signal E. The output signals A and B of the window comparator, the level signal 1e and output signals of the phase comparator 50, are combined by a combining circuit formed by AND-gates 52, 53 and 54 and OR-gate 55. An AND-gate 56, also forming part of the combining circuit, can receive a control signal sea in order to enable operation of the tuning detector 17 in the search mode, as described, above with two sets of reference signals: ref1 and ref2, and ref6, respectively. The control signal sea also controls a switch 57.

Figure 4:
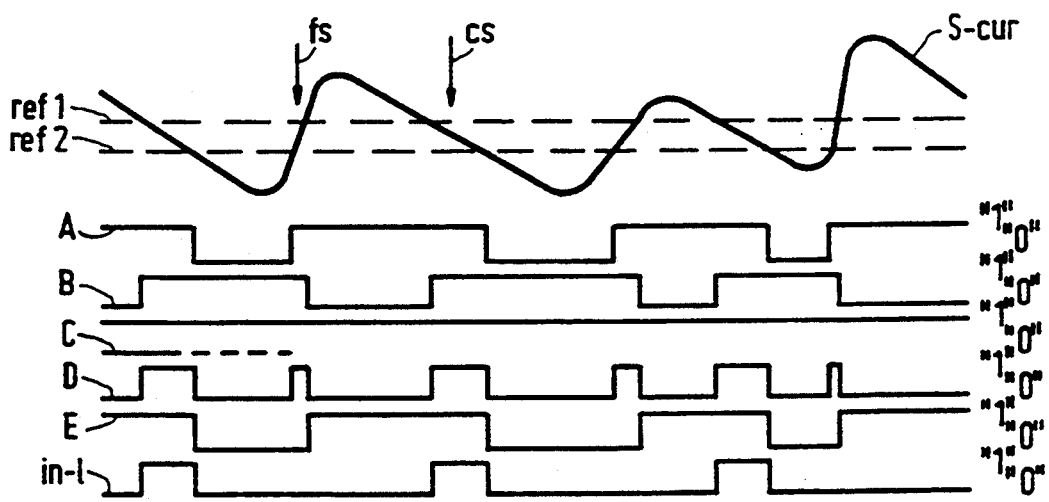
FIG. 4 shows signals in a detection device as shown in FIG. 3 as a function of time.

FIG. 4 shows the signals A, B, C, D, E and in-1 in a in-lock tuning detector 17 as shown in FIG. 3, as a function of time t, and also a curve showing variation with time of an S-curve S-cur over a frequency band which is so busy that S-curves of individual stations influence one another. The reference signals ref1 and ref2 of the window comparator 20, 21 are represented in the time variation S-cur of the S-curve. The signal C, being a digital representation of the level signal 1e, always has the logic value "1" in the present embodiment because the level signal 1e does not decrease sufficiently between stations in the case of a busy frequency band. The operation of the in-lock tuning detector shown in FIG. 3 will be described with reference to the signal behaviour in FIG. 4, which also shows a correct slope cs and a wrong slope fs of the S-curve. During an up-search in the frequency band towards a station, in the event of a correct slope cs the output signal A of the comparator 20 becomes logic "1" before the output signal B of the comparator 21 becomes logic "0", whereas in the event of a wrong slope fs the output signal B of the comparator 21 becomes logic "1" before the output signal A of the comparator 20 becomes logic "0". During a down-search, these signals exhibit a similar behaviour, but in the reverse sense. Thus, the phase relation between the signals A and B, detected by the phase comparator 50, is the key to slope detection. It is to be noted that the signal D, which does not include the slope detection signal f, varies like in the tuning detector known from the above-referenced Japanese application. That is, it includes Kokai 60-7222/85, incorrect "in-lock" pulses caused by the wrong slope of the S-curve, whereas the in-lock signal in-1 in accordance with the invention does not contain incorrect in-lock pulses. In order to ensure that only correct in-channel or in-lock signals are generated during an up-search and a during down-search, the AND-gates 53, 54 in the tuning detector 17 have inputs 58 and 59 for receiving enable signals up and dn, respectively, to enable up-search and down-search.

Figure 5:
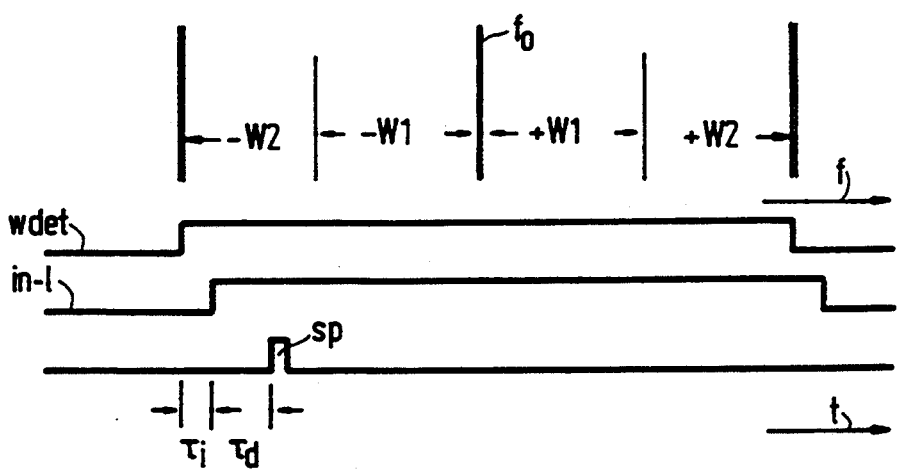
FIG. 5 shows the switching of reference signals in a detection device as shown in FIG. 3.

FIG. 5 shows switching of the reference signals used as shown in FIG. 3 by means of the control signal sea whereby the window comparator 20, 21 can be adjusted for the search mode. For the above signals a a as function of time t, including the in-channel signal in-1, the frequency windows are shown as a function of frequency f. The search mode will be described hereinafter with reference to a receiver 1 as shown in FIG. 1. It is assumed that a frequency window $-W2, +W2$ of the window comparator, situated around a desired tuning frequency $f_0$, is 40 kHz and that a frequency window of the frequency loop L2 in FIG. 2 is 20 kHz as may be the case in the event of FM. As soon as the in-lock signal in-1 appears in the receiver I in the search mode, which signal is delayed by an amount of $\tau_i$ relative to the "real" window detection signal wdet due to the filter 25, the search mode is stopped and the AFC loop L1 should adjust the tuning oscillator 6 to the desired tuning frequency $f_0$. After a brief delay $\tau_d$, for example 50 ms, subsequent to the beginning of the in-lock signal in-1, frequency measurement by the frequency detector 13 commences as indicated by a start pulse sp. It may then occur that the AFC loop L1 has not yet pulled the frequency of the tuning oscillator 6 within the frequency window of the preset mode, so that the frequency detector 13 measures a frequency which is more than 20 kHz removed from the desired tuning frequency $f_0$. This is not problematic as long as no fading is involved, but in the case of fading the in-lock signal in-1 temporarily disappears, the preset mode loop L2 is activated and the frequency of the tuning oscillator 6 is adjusted, by the last-channel memory 15, to the frequency measured in the search mode. The AFC loop L1 will then tend to tune to the frequency $f_0$, but because the frequency deviation amounts to more than 20 kHz, no in-window signal in-w will be generated; the latter signal should be present in the receiver 1 shown in FIG. 1 in order to stop the tuning process, so that the loop L2 remains active and the detected signal AF in the receiver 1 remains "mute". When a narrower windower window $-W1, +W1$ is chosen, for example 8.8 kHz, during the search mode, the above problem can be avoided and, moreover, the S-curve can be filtered more and interference due to audio modulation in the FM detector 5 is also reduced. The cut-off frequency of the filter 25 is, for example 80 Hz or less and the in-lock signal in-1 can be generated in the presence of only one non-critical time constant. In the search mode, the reference signals ref1 and ref6 are switched on, corresponding to a narrower frequency window, and as soon as the in-lock signal in-1 is present, the reference signals ref1 and ref2 are activated, corresponding to a wider frequency window.

Figure 6A:
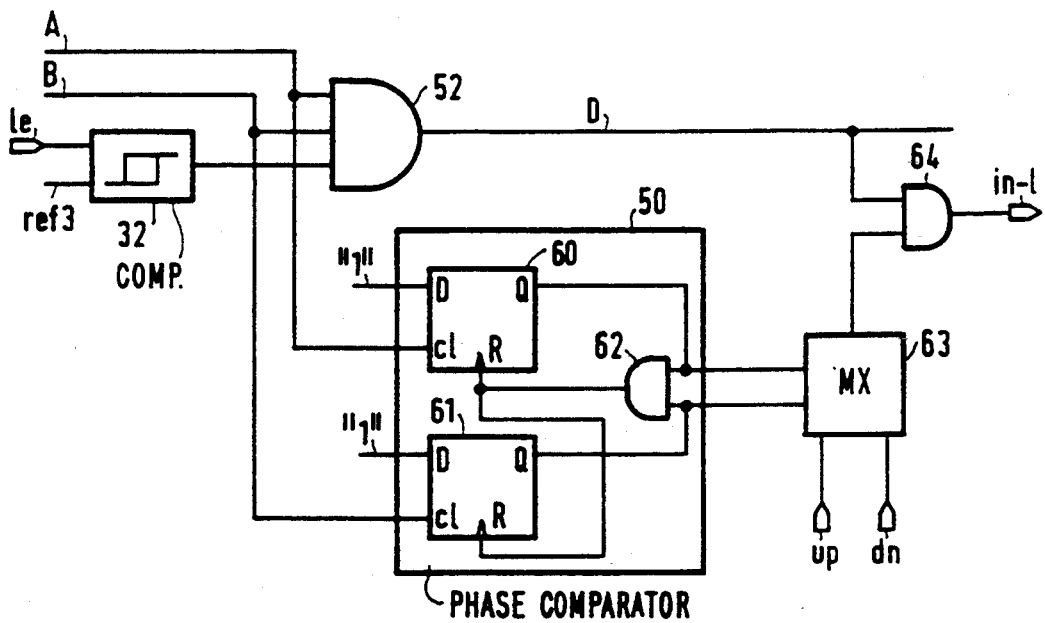
FIG. 6A shows a further elaboration of a part of the second embodiment of the tuning detector as shown in FIG. 3.

FIG. 6A shows a further elaboration of a part of the second embodiment of a tuning detector 17 in accordance with the invention, as shown in FIG. 3. The further elaboration concerns the phase comparator 50 which, in FIG. 6A it comprises a first D-tiptop 60, a second D-tiptop 61, and an AND-gate 62. The flipflops 60 and 61 comprise inputs D, c1 and R and an output Q. The D-input of the flipflop 60 receives a logic "1" signal and its clock input c1 receives the signal A. The D-input of the flipflop 61 receives a logic "1" signal and its clock input c1 receives the signal B. At the output side, outputs of the phase comparator are connected to respective outputs Q of the flipflops 60 and 61, which outputs also apply, via the AND-gate 62, reset signals to the respective reset inputs of the flipflops 60 and 61. Also shown are a multiplexer 63 and an AND-gate 64, replacing the gates 53, 54 and 55 of FIG. 3. The operation of the circuit shown in FIG. 6A corresponds to that of the corresponding part of FIG. 3.

Figure 6B:
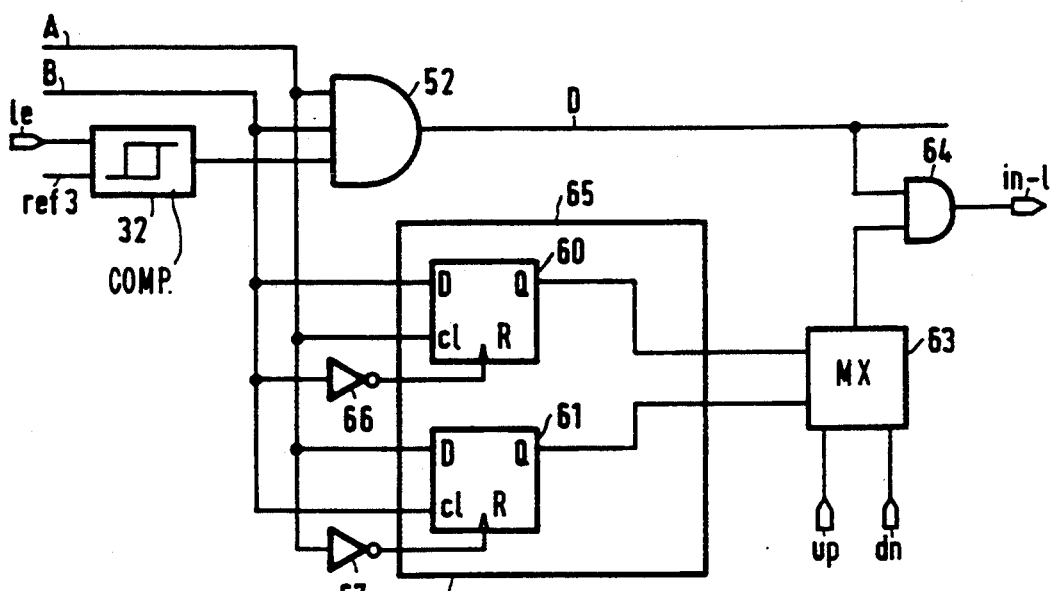
FIG. 6B shows a modification of the part of the circuit of FIG. 3.

FIG. 6B shows a modification of the part of the circuit of FIG. 3 which is shown in FIG. 6A. Shown is a modified phase comparator 65 which comprises, like the phase comparator 50, the flipflops 60 and 61 but not the AND-gate 62. In FIG. 6B the D-input of the flipflop 60 receives the signal B and its R-input or reset input receives the inverse of the signal B, derived from the signal by means of an inverter 66. The D-input of the flipflop 61 receives the signal A and its R-input receives the inverse of the signal A which is obtained by inversion of the signal A By means of an inverter 67. It is thus achieved that, in contrast with the non-modified phase detector 50, the operation of the flipflops 60 and 61 is fully independent. Such independent operation is necessary when the S-curve is distorted to such an extreme that the S-curve signal exceeds the reference signal ref1 but not the reference signal ref2, as shown in FIG. 4, and vice versa. In the event of such strong distortion of the S-curve, the phase comparator 65 does not have this drawback. One flipflop in the modified phase comparator 65 then detects the S-curve entering the window formed by the references ref1 and ref2 in a given direction, and the Q-output thereof remains high until the S-curve leaves the window in the same direction; the other flipflop performs the same function, be it in the opposite direction.

We claim:

1. An in-lock tuning detector for use in an FM radio receiver for detecting when a selected tuning frequency window of the receiver includes a tuning frequency of a received frequency modulated radio frequency (RF) signal, the receiver having a selectable tuning frequency and comprising: FM detecting means having an S-curve frequency detection characteristic for deriving a demodulated signal from the received RF signal, means responsive to the demodulated signal to set the tuning frequency of the receiver in accordance with the tuning frequency of the received RF signal, and a level detector for detecting a signal level of the received RF signal; said tuning detector comprising:

a window comparator coupled to said FM detecting means to derive from said demodulated signal first and second logic signals indicative of whether the tuning frequency of the received RF signal is below or above said selected tuning frequency window;

a signal level comparator coupled to said level detector for producing a third logic signal indicative of whether a signal level of the received RF signal exceeds a predetermined threshold; and a first combinational circuit coupled to said window comparator and to said signal level comparator for combining said first, second and third logic signals to derive a fourth logic signal which is indicative of whether the selectable tuning frequency of the received RF signal is within said selected tuning frequency window, said fourth logic signal being subject to error for tuning frequencies of the received RF signal for which said FM detecting means operates on an incorrect slope portion of said S-curve;

characterized in said tuning detector further comprises:

differentiating circuit means coupled to said FM detecting means to receive said demodulated signal and by differentiation derive therefrom a fifth logic signal indicative of whether said demodulated signal was produced by said FM detecting means by operation on a correct slope portion of said S-curve; and a second combinational circuit coupled to said differentiating circuit means and to said first combinational circuit for combining said fourth and fifth logic signals to derive therefrom a lock-in detection signal indicative of whether the received RF signal is within said selected frequency window, and which is based on operation of said FM detecting means on said correct slope portion of said S-curve.

2. A tuning detector as claimed in claim 1, wherein said window comparator sets the width of said frequency window in accordance with reference level signals supplied thereto; and further comprising means for supplying reference level signals to said window comparator which produce a narrower width of said frequency window when said radio receiver is operated in a search mode to detect an RF signal having a tuning frequency which is outside an already existing frequency window.

3. A tuning detector as claimed in claim 1, in combination with means for controlling the tuning frequency of said radio receiver so that said frequency window is centered on the tuning frequency of the frequency modulated RF signal sought to be received.

4. An in-lock tuning detector for use in an FM radio receiver for detecting when a selected tuning frequency window of the receiver includes a tuning frequency of a received frequency modulated radio frequency (RF) signal; the receiver having a selectable tuning frequency and comprising FM detecting means having an S-curve frequency detection characteristic for deriving a demodulated signal from the received RF signal, means responsive to the demodulated signal to set the tuning frequency of the receiver in accordance with the tuning frequency of the received RF signal, and a level detector for detecting a signal level of the received RF signal; said tuning detector comprising:

a window comparator coupled to said FM detecting means to derive from said demodulated signal first and second logic signals indicative of whether the tuning frequency of the received RF signal is below or above said selected tuning frequency window;

a signal level comparator coupled to said level detector for producing a third logic signal indicative of whether a signal level of the received RF signal exceeds a predetermined threshold; and a first combinational circuit coupled to said window comparator and to said signal level comparator for combining said first, second and third logic signals to derive a fourth logic signal which is indicative of whether the selectable tuning frequency of the received RF signal is within said selected tuning frequency window, said fourth logic signal being subject to error for tuning frequencies of the received RF signal for which said FM detecting means operates on an incorrect slope portion of said S-curve;

characterized in said tuning detector further comprises:

phase detecting means coupled to said window comparator to detect a phase difference between said first and second logic signals, and based thereon to produce a fifth logic signal indicative of whether said demodulated signal was produced by operation of said FM detecting means on a correct portion of said S-curve; and a second combinational circuit coupled to said phase detecting means and to said first combinational circuit for combining said fourth and fifth logic signals to derive therefrom a lock-in detection signal indicative of whether the received RF signal is within said selected frequency window, and which is based on operation of said FM detecting means on said correct slope portion of said S-curve.

5. A tuning detector as claimed in claim 4, wherein said window comparator sets the width of said frequency window in accordance with reference level signals supplied thereto; and further comprising means for supplying reference level signals to said window comparator which produce a narrower width of said frequency window when said radio receiver is operated in a search mode to detect an RF signal having a tuning frequency which is outside an already existing frequency window.

6. A tuning detector as claimed in claim 4, in combination with means for controlling the tuning frequency of said radio receiver so that said frequency window is centered on the tuning frequency of the frequency modulated RF signal sought to be received.

* * * * *